United States Patent
Wu et al.

(10) Patent No.: US 9,653,179 B2
(45) Date of Patent: May 16, 2017

(54) SHIFT REGISTER, DRIVING METHOD AND GATE DRIVING CIRCUIT

(71) Applicants: Shanghai Tianma AM-OLED Co., Ltd., Shanghai (CN); Tianma Micro-Electronics Co., Ltd., Shenzhen (CN)

(72) Inventors: Tong Wu, Shanghai (CN); Dong Qian, Shanghai (CN); Tong Zhang, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 106 days.

(21) Appl. No.: 14/860,334

(22) Filed: Sep. 21, 2015

(65) Prior Publication Data

US 2016/0189796 A1 Jun. 30, 2016

(30) Foreign Application Priority Data

Dec. 30, 2014 (CN) .......................... 2014 1 0857251

(51) Int. Cl.
  *G11C 19/00* (2006.01)
  *G11C 19/28* (2006.01)
  *G09G 5/00* (2006.01)

(52) U.S. Cl.
  CPC ............. *G11C 19/28* (2013.01); *G09G 5/003* (2013.01); *G09G 2300/0426* (2013.01); *G09G 2300/0871* (2013.01); *G09G 2310/0286* (2013.01); *G09G 2310/0289* (2013.01); *G09G 2310/08* (2013.01)

(58) Field of Classification Search
  None
  See application file for complete search history.

(56) References Cited

U.S. PATENT DOCUMENTS

| | | | |
|---|---|---|---|
| 2009/0290677 A1* | 11/2009 | Otose | G09G 3/3266 377/78 |
| 2012/0300894 A1* | 11/2012 | Wu | G11C 19/184 377/79 |

(Continued)

FOREIGN PATENT DOCUMENTS

| | | |
|---|---|---|
| CN | 103559913 A | 2/2014 |
| JP | 2010238323 A | 10/2010 |

*Primary Examiner* — Tuan T Lam
(74) *Attorney, Agent, or Firm* — Alston & Bird LLP

(57) ABSTRACT

Embodiments of the disclosure provide a shift register, a driving method and a gate driving circuit. In an embodiment, the shift register includes: a first transistor, a second transistor, a third transistor, a fourth transistor, a fifth transistor, a sixth transistor, a seventh transistor, an eighth transistor, a ninth transistor, a first storage capacitor and a second storage capacitor. The shift register is driven by the cooperation of the respective transistors. In the case that the shift register is applied in the gate driving circuit to implement a line-by-line scanning, shift registers corresponding to two adjacent pixel rows are cascaded directly and no inverters are provided following the shift registers corresponding to the respective pixel rows, thereby decreasing the number of transistors in the gate driving circuit, reducing the layout area of the gate driving circuit, and being advantageous for narrowing the border.

16 Claims, 4 Drawing Sheets

(56) References Cited

U.S. PATENT DOCUMENTS

| | | | |
|---|---|---|---|
| 2014/0079176 A1* | 3/2014 | Qian | G11C 19/28 377/77 |
| 2014/0140468 A1* | 5/2014 | Cheng | G11C 19/28 377/68 |
| 2015/0302933 A1* | 10/2015 | Ma | G11C 19/28 345/215 |
| 2016/0133184 A1* | 5/2016 | Gupta | G09G 3/3233 345/690 |
| 2016/0133211 A1* | 5/2016 | Ma | G11C 19/28 345/205 |
| 2016/0189626 A1* | 6/2016 | Sun | G09G 3/3266 345/212 |
| 2016/0217870 A1* | 7/2016 | Tseng | G11C 19/28 |
| 2016/0321999 A1* | 11/2016 | Yang | G09G 3/20 |

\* cited by examiner

SHIFT REGISTER, DRIVING METHOD AND GATE DRIVING CIRCUIT

CROSS REFERENCE TO RELATED APPLICATIONS

The present application claims the priority to Chinese Patent Application No. 201410857251.1, entitled "SHIFT REGISTER, DRIVING METHOD AND GATE DRIVING CIRCUIT", filed on Dec. 30, 2014 with the State Intellectual Property Office of People's Republic of China, which is incorporated herein by reference in its entirety.

FIELD OF THE INVENTION

This disclosure relates to driving technology, and, in particular, to a shift register, a driving method and a gate driving circuit.

BACKGROUND OF THE INVENTION

A display panel in the conventional technology generally includes pixel units defined by intersections of multiple pixel rows and multiple pixel columns. To display an image, the conventional display panel is usually driven by a line-by-line scanning performed by a gate driving circuit, i.e., the multiple pixel rows are provided row by row with a driving signal. In addition, the conventional gate driving circuit is triggered by a low level. As shown in FIG. 1, the conventional gate driving circuit generally includes a shift register portion 34 and an inverter portion 36 to implement the function of line-by-line scanning, and a shift register corresponding to each pixel row is followed by three cascaded inverters. Hence, the gate driving circuit includes a large number of transistors and occupies a large area of the layout, which is disadvantageous for narrowing the border of the display panel.

BRIEF SUMMARY OF THE INVENTION

To solve the technical problems above, a shift register, a driving method and a gate driving circuit are provided according to embodiments of the disclosure. Hence, the number of transistors in the gate driving circuit is decreased and a layout area of the gate driving circuit is reduced, which is advantageous for narrowing the border.

An embodiment of the disclosure discloses a shift register. The shift register includes: a first transistor, a second transistor, a third transistor, a fourth transistor, a fifth transistor, a sixth transistor, a seventh transistor, an eighth transistor, a ninth transistor, a first storage capacitor and a second storage capacitor.

The first transistor is controlled by a voltage of a first node and is configured to transmit a first reference voltage to an output terminal of the shift register.

The second transistor is controlled by a voltage of a second node and is configured to transmit a second reference voltage to the output terminal, wherein the second reference voltage is lower than the first reference voltage.

The third transistor is controlled by a first clock signal and is configured to transmit the first reference voltage to the first node.

The fourth transistor is controlled by a voltage of a third node and is configured to transmit a second clock signal to the first node.

The fifth transistor is controlled by the first clock signal and is configured to transmit a control signal to the second node.

The sixth transistor is controlled by the first clock signal and is configured to transmit an input signal to a fourth node.

The seventh transistor is controlled by a voltage of the fourth node and is configured to transmit the first reference voltage to the third node.

The eighth transistor is controlled by the first clock signal and is configured to transmit a voltage of a fifth node to the third node.

The ninth transistor is controlled by the second reference voltage and is configured to transmit the second reference voltage to the fifth node.

The voltage of the fourth node is input to one polar plate of the first storage capacitor, and the first reference voltage is input to the other polar plate of the first storage capacitor.

The voltage of the second node is input to one polar plate of the second storage capacitor, and a voltage of the output terminal is input to the other polar plate of the second storage capacitor.

An embodiment of the disclosure discloses a driving method applied to the shift register described above, where the control signal is the first clock signal or the second reference voltage, and the driving method includes:

at a first stage, maintaining the input signal at a first level, maintaining the first clock signal at a second level and maintaining the second clock signal at the first level to turn on the fifth transistor, the sixth transistor, the eighth transistor and the ninth transistor; where the first level is higher than the second level; since the eighth transistor and the ninth transistor are turned on, the second reference voltage is transmitted to the third node to turn on the fourth transistor, and the second clock signal at the first level is transmitted to the first node to turn off the first transistor; since the sixth transistor is turned on, the input signal at the first level is transmitted to the fourth node to charge the first storage capacitor; since the fifth transistor is turned on, the control signal is transmitted to the second node to turn on the second transistor, and the second reference voltage is transmitted to the output terminal via the second transistor and is output from the output terminal;

at a second stage, maintaining the input signal at the second level, maintaining the first clock signal at the first level and maintaining the second clock signal at the second level, where the voltage of the third node is at the second level to turn on the fourth transistor, the second clock signal at the second level is transmitted to the first node via the fourth transistor to turn on the first transistor, and the first reference voltage is transmitted to the output terminal via the first transistor and is output from the output terminal;

at a third stage, maintaining the input signal at the second level, maintaining the first clock signal at the second level and maintaining the second clock signal at the first level to turn on the fifth transistor, where the control signal at the second level is transmitted to the second node via the fifth transistor to turn on the second transistor and the second storage capacitor controls the second transistor to be turned on through a coupling function, and the second reference voltage is transmitted to the output terminal via the second transistor and is output from the output terminal; and at a fourth stage, maintaining the input signal at the second level, maintaining the first clock signal at the first level and maintaining the second clock signal at the second level, where the voltage of the second node is the second level stored by the second storage capacitor, the second transistor is turned on, and the second reference voltage is transmitted to the output terminal via the second transistor and is output from the output terminal.

A gate driving circuit is provided. The gate driving circuit includes N cascaded shift registers. The N cascaded shift registers include a shift register in a first stage to a shift register in an N-th stage, where N is a positive integer greater than 2 and the shift register is the shift register described above.

Compared with the conventional technology, the above technical solutions have the following advantages. The shift register according to the embodiments of the disclosure includes a first transistor, a second transistor, a third transistor, a fourth transistor, a fifth transistor, a sixth transistor, a seventh transistor, an eighth transistor, a ninth transistor, a first storage capacitor and a second storage capacitor. The shift register is triggered by a high level and is driven by the cooperation of the respective transistors. In the case that the shift register is applied in the gate driving circuit to implement a line-by-line scanning, shift registers corresponding to two adjacent pixel rows are cascaded directly and a high level signal is transmitted stage by stage, thereby triggering the shift registers without any inverters following the shift registers corresponding to the respective pixel rows. Therefore, the number of the transistors in the gate driving circuit is decreased and a layout area of the gate driving circuit is reduced, which is advantageous for narrowing the border.

BRIEF DESCRIPTION OF THE DRAWINGS

Drawings to be used in describing embodiments or the conventional technology are simply described hereinafter to clearly illustrate technical solutions in the embodiments of the disclosure or the conventional technology. Apparently, the drawings described below are only for the embodiments of the disclosure, and other drawings may also be obtained based on the provided drawings by those skilled in the art without any creative work.

DETAILED DESCRIPTION OF THE INVENTION

Technical solutions in embodiments of the disclosure are described clearly and completely hereinafter in conjunction with drawings in the embodiments of the disclosure. Apparently, the described embodiments are only some of rather than all of the embodiments of the disclosure, but not all the embodiments. Any other embodiments obtained based on the embodiments of the disclosure by those skilled in the art without any creative work fall within the scope of protection of the disclosure.

Figure 1:
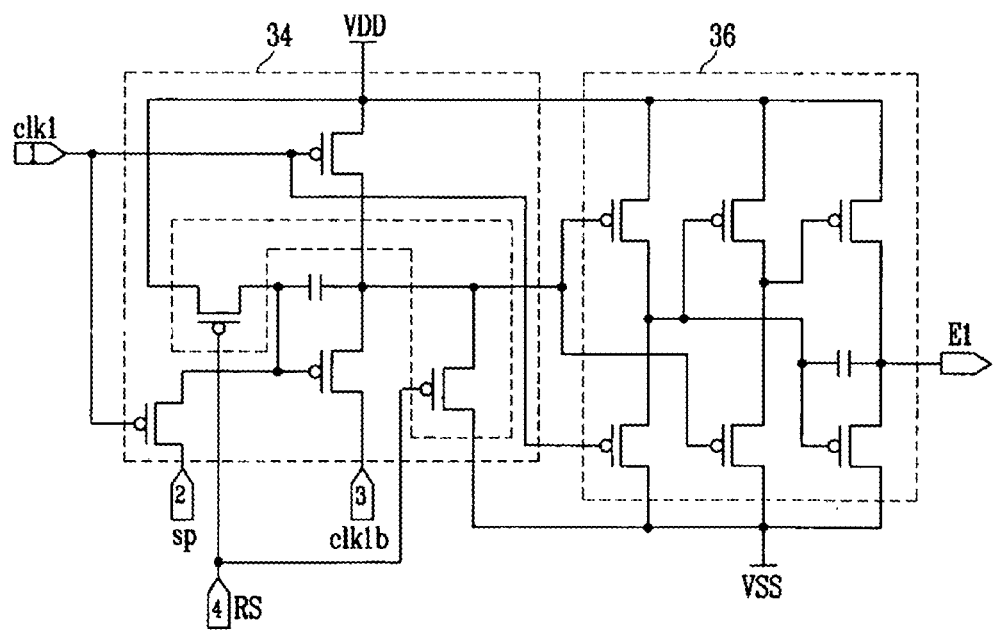
FIG. 1 is a schematic circuit diagram of a conventional gate driving circuit.
Figure 2:
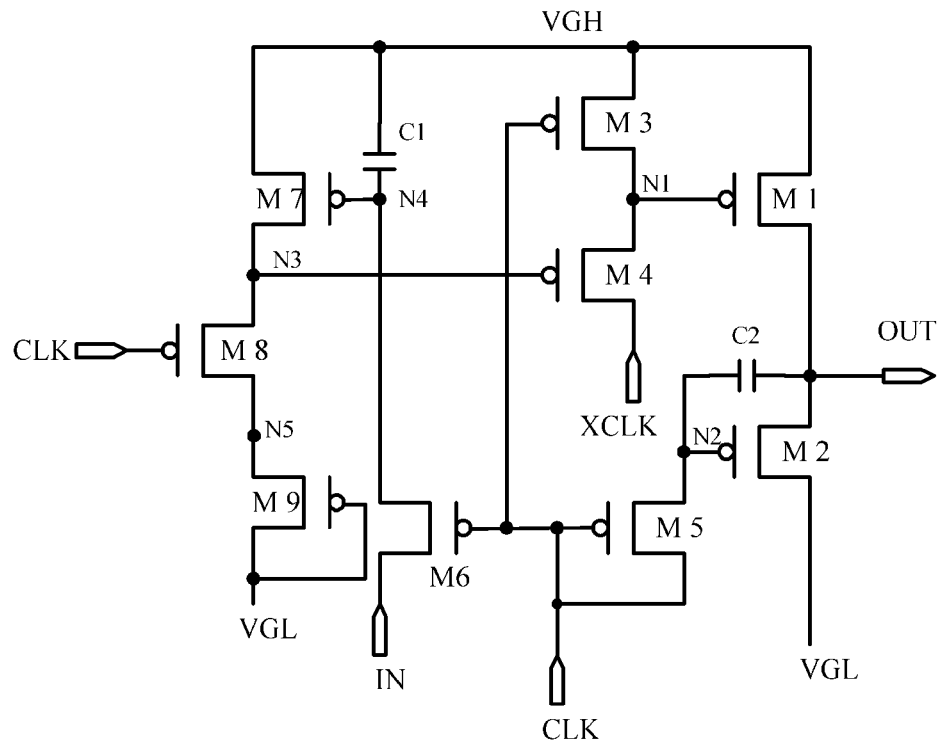
FIG. 2 is a schematic circuit diagram of a shift register according to an embodiment of the disclosure.

A shift register is provided according to an embodiment of the disclosure. As shown in FIG. 2, the shift register includes: a first transistor M1, a second transistor M2, a third transistor M3, a fourth transistor M4, a fifth transistor M5, a sixth transistor M6, a seventh transistor M7, an eighth transistor M8, a ninth transistor M9, a first storage capacitor C1 and a second storage capacitor C2. The first transistor M1 is controlled by a voltage of a first node N1 and configured to transmit a first reference voltage VGH to an output terminal OUT of the shift register. The second transistor M2 is controlled by a voltage of a second node N2 and configured to transmit a second reference voltage VGL to the output terminal OUT of the shift register, where the second reference voltage VGL is lower than the first reference voltage VGH. The third transistor M3 is controlled by a first clock signal CLK and configured to transmit the first reference voltage VGH to the first node N1. The fourth transistor M4 is controlled by a voltage of a third node N3 and configured to transmit a second clock signal XCLK to the first node N1. The fifth transistor M5 is controlled by the first clock signal CLK and configured to transmit a control signal to the second node N2. The sixth transistor M6 is controlled by the first clock signal CLK and configured to transmit an input signal IN to a fourth node N4. The seventh transistor M7 is controlled by a voltage of the fourth node N4 and configured to transmit the first reference voltage VGH to the third node N3. The eighth transistor M8 is controlled by the first clock signal CLK and configured to transmit a voltage of a fifth node N5 to the third node N3. The voltage of the fourth node N4 is input to one polar plate of the first storage capacitor C1, and the first reference voltage VGH is input to the other polar plate of the first storage capacitor C1. The voltage of the second node N2 is input to one polar plate of the second storage capacitor C2, and a voltage of the output terminal OUT is input to the other polar plate of the second storage capacitor C2.

Specifically, based on the above embodiment, in an embodiment of the disclosure, a gate of the first transistor M1 is electrically connected to the first node N1, the first reference voltage VGH is input to a first electrode of the first transistor M1, and a second electrode of the first transistor M1 is electrically connected to the output terminal OUT. A gate of the second transistor M2 is electrically connected to the second node N2, a first electrode of the second transistor M2 is electrically connected to the output terminal OUT, and the second reference voltage VGL is input to a second electrode of the second transistor M2. The first clock signal CLK is input to a gate of the third transistor M3, the first reference voltage VGH is input to a first electrode of the third transistor M3, and a second electrode of the third transistor M3 is electrically connected to the first node N1. A gate of the fourth transistor M4 is electrically connected to the third node N3, a first electrode of the fourth transistor M4 is electrically connected to the first node N1, and the second clock signal XCLK is input to a second electrode of the fourth transistor M4. The first clock signal CLK is input to a gate of the fifth transistor M5, a first electrode of the fifth transistor M5 is electrically connected to the second node N2, and the control signal is input to a second electrode of the fifth transistor M5. The first clock signal CLK is input to a gate of the sixth transistor M6, a first electrode of the sixth transistor M6 is electrically connected to the fourth node N4, and the input signal IN is input to a second electrode of the sixth transistor M6. A gate of the seventh transistor M7 is electrically connected to the fourth node N4, the first reference voltage VGH is input to a first electrode of the seventh transistor M7, and a second electrode of the seventh transistor M7 is electrically connected to the third node N3. The first clock signal CLK is input to a gate of the eighth transistor M8, a first electrode of the eighth transistor M8 is electrically connected to the third node N3, and a second electrode of the eighth transistor M8 is electrically connected to the fifth node N5. The second reference voltage VGL is input to a gate of the ninth transistor M9, a first electrode of the ninth transistor M9 is electrically connected to the fifth node N5, and the second reference voltage VGL is input to a second electrode of the ninth transistor M9. One polar plate of the first storage capacitor C1 is electrically connected to the fourth node N4, and the other polar plate of the first storage capacitor C1 is electrically connected to the first electrode of the seventh transistor M7. One polar plate of the second storage capacitor C2 is electrically connected to the second node N2, and the other polar plate of the second storage capacitor C2 is electrically connected to the output terminal OUT.

Figure 3:
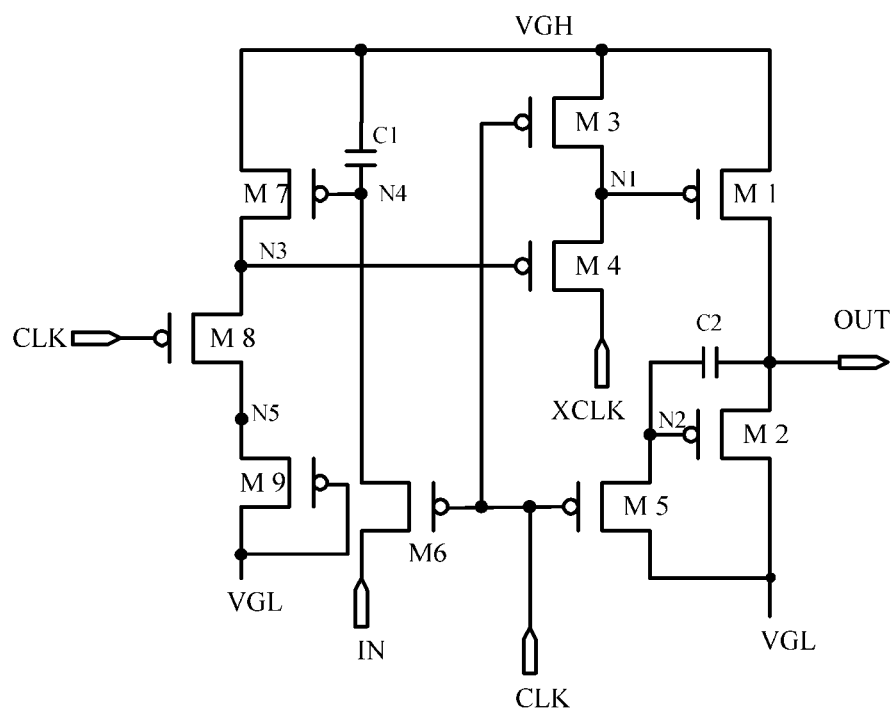
FIG. 3 is a schematic circuit diagram of a shift register according to another embodiment of the disclosure.

Based on the above embodiments, in a preferred embodiment of the disclosure, as shown in FIG. 2, the control signal is the first clock signal CLK and the first clock signal CLK is input to the second electrode of the fifth transistor M5. In another preferred embodiment of the disclosure, as shown in FIG. 3, the control signal is the second reference voltage VGL and the second reference voltage VGL is input to the second electrode of the fifth transistor M5. The control signal is not limited in the disclosure and is set based on specific situations.

Figure 4:
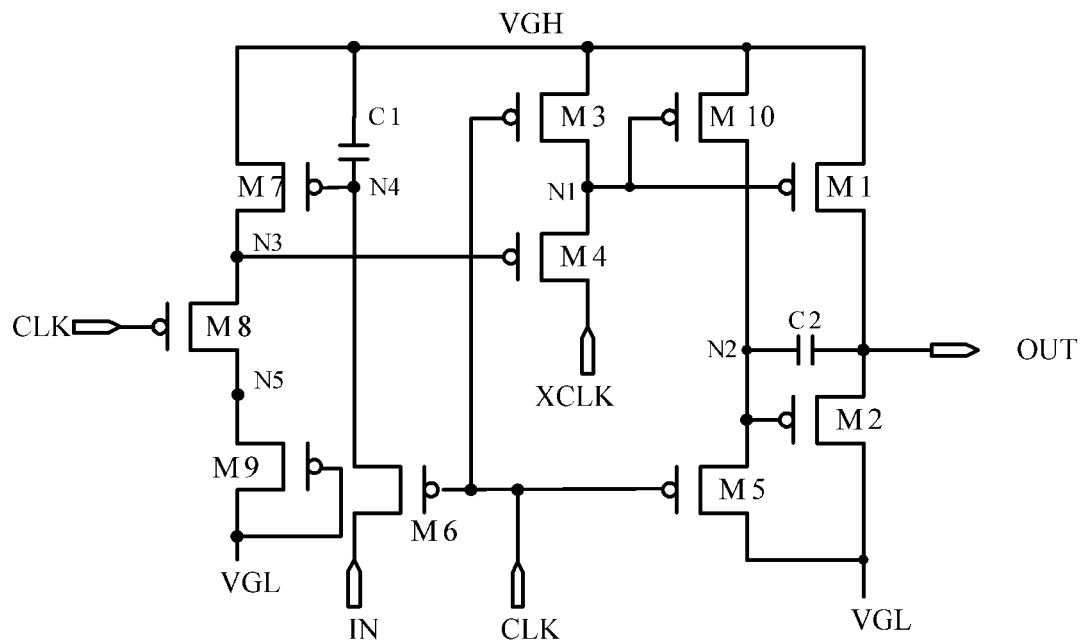
FIG. 4 is a schematic circuit diagram of a shift register according to still another embodiment of the disclosure.

Based on any one of the above embodiments, in an embodiment of the disclosure, as shown in FIG. 4, the shift register further includes a tenth transistor M10. In the embodiment, the tenth transistor M10 is controlled by the voltage of the first node N1 and configured to transmit the first reference voltage VGH to the second node N2.

Specifically, based on the above embodiments, in an embodiment of the disclosure, a gate of the tenth transistor M10 is electrically connected to the first node N1, the first reference voltage VGH is input to a first electrode of the tenth transistor M10, and a second electrode of the tenth transistor M10 is electrically connected to the second node N2.

It should be noted that, based on any one of the above embodiments, in a preferred embodiment of the disclosure, the first clock signal CLK and the second clock signal XCLK each has multiple first levels and multiple second levels, and the first levels and the second levels are alternate. The first level is the first reference voltage VGH, and the second level is the second reference voltage VGL.

It should be noted that, in the embodiments of the disclosure, each transistor in the shift register is preferably a P-type transistor, which is not limited in the disclosure. Alternatively, in other embodiments of the disclosure, each transistor in the shift register may be an N-type transistor, or a part of the transistors are N-type transistors and the other part of the transistors are P-type transistors, which depends on the specific situations.

The shift register provided by the embodiments of the disclosure may be triggered by a high level and may be driven by the cooperation of the transistors. In the case that the shift register is applied in the gate driving circuit to implement the line-by-line scanning, shift registers corresponding to two adjacent pixel rows are cascaded directly and a high level signal is transmitted stage by stage, thereby triggering the shift registers without any inverters following the shift registers corresponding to the respective pixel rows. Therefore, the number of transistors in the gate driving circuit is decreased and a layout area of the gate driving circuit is reduced, which is advantageous for narrowing the border.

Correspondingly, a driving method is provided according to an embodiment of the disclosure. The driving method is applied to the shift register provided according to any of the above embodiments, where the control signal is the first clock signal CLK or the second reference voltage VGL. The driving method includes the following steps.

At a first stage, the input signal IN is maintained at a first level, the first clock signal CLK is maintained at a second level and the second clock signal XCLK is maintained at the first level. The first level is higher than the second level. In this case, the fifth transistor M5, the sixth transistor M6, the eighth transistor M8 and the ninth transistor M9 are turned on. Since the eighth transistor M8 and the ninth transistor M9 are turned on, the second reference voltage VGL is transmitted to the third node N3 to turn on the fourth transistor M4, and the second clock signal XCLK at the first level is transmitted to the first node N1 to turn off the first transistor M1. Since the sixth transistor M6 is turned on, the input signal IN at the first level is transmitted to the fourth node N4 to charge the first storage capacitor C1. Since the fifth transistor M5 is turned on, the control signal is transmitted to the second node N2 to turn on the second transistor M2, and the second reference voltage VGL is transmitted to the output terminal OUT via the second transistor M2 and output from the output terminal OUT.

At a second stage, the input signal IN is maintained at the second level, the first clock signal CLK is maintained at the first level and the second clock signal XCLK is maintained at the second level. Since a voltage of the third node N3 is the second level, the fourth transistor M4 is turned on, the second clock signal XCLK at the second level is transmitted to the first node N1 via the fourth transistor M4, the first transistor M1 is further turned on, and the first reference voltage VGH is transmitted to the output terminal OUT via the first transistor M1 and output from the output terminal OUT.

At a third stage, the input signal IN is maintained at the second level, the first clock signal CLK is maintained at the second level and the second clock signal XCLK is maintained at the first level. In this case, the fifth transistor M5 is turned on. The control signal at the second level is transmitted to the second node N2 via the fifth transistor M5 to turn on the second transistor M2. In addition, the second storage capacitor C2 controls the second transistor M2 to be turned on through a coupling function. The second reference voltage VGL is transmitted to the output terminal OUT via the second transistor M2 and is output from the output terminal OUT.

At a fourth stage, the input signal IN is maintained at the second level, the first clock signal CLK is maintained at the first level and the second clock signal XCLK is maintained at the second level. Since a voltage of the second node N2 is the second level stored by the second storage capacitor C2, the second transistor M2 is turned on, and the second reference voltage VGL is transmitted to the output terminal OUT via the second transistor M2 and is output from the output terminal OUT.

Based on the above embodiment, in an embodiment of the disclosure, the first level is the first reference voltage VGH, and the second level is the second reference voltage VGL. Preferably, the first reference voltage VGH is a high level and the second reference voltage VGL is a low level, which is not limited in the disclosure and depends on the specific situations.

Preferably, based on any one of the above embodiments, in an embodiment of the disclosure, a width to length ratio of a channel of the seventh transistor M7 is greater than that of a channel of the ninth transistor M9. Hence, in a process of turning on the seventh transistor M7 and the ninth transistor M9, the seventh transistor M7 is turned on faster than the ninth transistor M9, and in a process of turning off the seventh transistor M7 and the ninth transistor M9, the seventh transistor M7 is turned off faster than the ninth transistor M9.

Based on the above embodiment, in another embodiment of the disclosure, a width to length ratio of a channel of the first transistor M1 is greater than that of a channel of the second transistor M2. Hence, in a process of turning on the first transistor M1 and the second transistor M2, the first transistor M1 is turned on faster than the second transistor M2, and in a process of turning off the first transistor M1 and the second transistor M2, the first transistor M1 is turned off faster than the second transistor M2.

It should be noted that, in the embodiments of the disclosure, each transistor in the shift register may be a P-type transistor or an N-type transistor, or a part of the transistors are P-type transistors and the other part of the transistors are N-type transistors, which is not limited in the disclosure and depends on the specific situations.

Hereinafter the driving method according to the embodiment of the disclosure is illustrated with an exemplary case that each transistor in the shift register is the P-type transistor, the first reference voltage VGH is a high level and the second reference voltage VGL is a low level.

Figure 5:
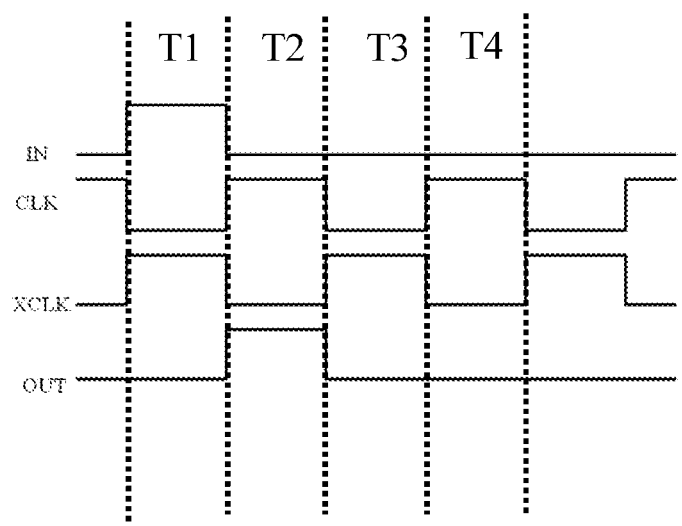
FIG. 5 is a sequence diagram of a driving method according to an embodiment of the disclosure.

Reference is made to FIG. 3 and FIG. 5, where FIG. 3 is a schematic circuit diagram of a shift register according to an embodiment of the disclosure, and FIG. 5 is a sequence diagram of a driving method according to an embodiment of the disclosure.

At a first stage, the input signal IN is at the high level, the first clock signal CLK is at the low level, and the second clock signal XCLK is at the high level. As shown in FIG. 2, the low level is constantly applied to the gate of the ninth transistor M9, and each transistor in the shift register is the P-type transistor, i.e., is turned on by a low level; hence, the ninth transistor M9 maintains turned on. The first clock signal CLK controls the gate of the eighth transistor M8 and the eighth transistor M8 is turned on by a low level; hence, the eighth transistor M8 is turned on if the first clock signal CLK is the low level. The second reference voltage VGL input to the second electrode of the ninth transistor M9 is transmitted to the third node N3, and accordingly, a voltage of the third node N3 is the low level. Since the voltage of the third node N3 controls the gate of the fourth transistor M4 and the voltage of the third node N3 is the low level, the fourth transistor M4 is turned on, and the second clock signal XCLK is transmitted to the first node N1. Since the second clock signal XCLK is the high level, a voltage of the first node N1 is the high level. Since the voltage of the first node N1 controls the gate of the first transistor M1, the first transistor M1 is turned off.

Since the first clock signal CKL is the low level and the first clock signal CKL controls gates of the fifth transistor M5, the sixth transistor M6 and the third transistor M3, the sixth transistor M6 is turned on at the first stage, the input signal IN is transmitted to the fourth node N4, and accordingly, a voltage of the fourth node N4 is at the high level; the fifth transistor M5 is turned on, the first clock signal CLK is transmitted to the second node N2, and accordingly, a voltage of the second node N2 is at the low level. Since the voltage of the second node N2 controls the gate of the second transistor M2, at the first stage the second transistor M2 is turned on, the second reference voltage VGL input to the second electrode of the second transistor M2 is transmitted to the output terminal OUT, and accordingly, the shift register outputs the low level.

At a second stage, the input signal IN is at the low level, the first clock signal CLK is at the high level, and the second clock signal XCLK is at the low level. In this case, since the first clock signal CLK is at the high level, the eighth transistor M8, the fifth transistor M5, the sixth transistor M6 and the third transistor M3 are turned off. Since the voltage of the fourth node is at the first level at the first stage and the sixth transistor M6 is turned off at the second stage, the voltage of the fourth node is maintained at the first level of the first stage due to the first storage capacitor C1, and the seventh transistor M7 is turned off. The voltage of the third node N3 is maintained at the low level of the first stage, so the fourth transistor M4 is turned on and the second clock signal XCLK input to the second electrode of the fourth transistor M4 is transmitted to the first node N1. The second clock signal XCLK is at the low level at the second stage, so the voltage of the first node N1 is at the low level, the first transistor M1 is turned on, the first reference voltage VGH input to the first electrode of the first transistor M1 is transmitted to the output terminal OUT, and accordingly, the shift register outputs the high level. Since the output terminal OUT is electrically connected to one polar plate of the second storage capacitor C2 and a common terminal of the second storage capacitor C2 and the output terminal OUT is at the high level, a common terminal of the second storage capacitor C2 and the second transistor M2 (i.e., the second node N2) is also at the high level, thereby quickly turning off the second transistor M2.

At a third stage, the input signal IN is at the low level, the first clock signal CLK is at the low level, and the second clock signal XCLK is at the high level. Since the first clock signal CLK is at the low level, the sixth transistor M6 is turned on, and the input signal IN input to the second electrode of the sixth transistor M6 is transmitted to the fourth node N4. Accordingly, a voltage of the fourth node N4 is at the low level, the seventh transistor M7 is turned on, and the first reference voltage VGH input to the first electrode of the seventh transistor M7 is transmitted to the third node N3. The eighth transistor M8 is also turned on and the second reference voltage VGL is transmitted to the third node N3. In the embodiment, since the width to length ratio of the channel of the seventh transistor M7 is greater than that of the channel of the ninth transistor M9, the seventh transistor M7 is turned on earlier than the ninth transistor M9; accordingly, at the third stage, the voltage of the third node N3 is the first reference voltage VGH which is the high level. The third transistor M3 is turned on, the first reference voltage VGH input to the first electrode of the third transistor M3 is transmitted to the first node N1, and accordingly, the voltage of the first node N1 is at the high level and the first transistor M1 is turned off. The fifth transistor M5 is turned on, the second reference voltage VGL input to the second electrode of the fifth transistor M5 is transmitted to the second node N2. Accordingly, the voltage of the second node N2 is at the low level, the second transistor M2 is turned on and the second reference voltage VGL input to the second electrode of the second transistor M2 is transmitted to the output terminal OUT, and the shift register outputs the low level.

One polar plate of the second storage capacitor C2 is electrically connected to the output terminal OUT, and the other polar plate of the second storage capacitor C2 is electrically connected to the second node N2 (the gate of the second transistor M2). Since the output terminal OUT outputs the high level at the second stage and outputs the low level at the third stage, and voltages at both polar plates of the second storage capacitor C2 are at low levels at the third stage, the voltage of the second node N2 may be further lowered due to the coupling function of the second storage capacitor C2, and accordingly, the second transistor M2 is completely turned on.

At a fourth stage, the input signal IN is at the low level, the first clock signal CLK is at the high level, and the second clock signal XCLK is at the low level. Since the first clock signal CLK is at the high level, the eighth transistor M8, the sixth transistor M6, the fifth transistor M5 and the third transistor M3 are all turned off. Since the voltage of third node N3 is at the high level at the third stage, the fourth transistor M4 is turned off; the voltage of the first node N1 is maintained at the high level of the third stage, and the first transistor M1 is turned off. Since the fifth transistor M5 is turned off, the voltage of the second node N2 is maintained at the low level of the third stage, the second transistor M2 is turned on, the second reference voltage VGL input to the second electrode of the second transistor M2 is transmitted to the output terminal OUT, and the output terminal OUT outputs the low level.

According to the above, the input signal IN is at the high level at the first stage and is at the low level at the second stage, the third stage and the fourth stage; while the output signal OUT is at the high level at the second stage, and is at the low level at the first stage, the third stage and the fourth stage. That is, the output signal OUT is output later than the input signal IN by one pulse. If an output signal of a shift register in a first stage is used as an input signal of a shift register in a second stage, an output signal of the shift register in the second stage is output later than the output signal of the shift register in the first stage by one pulse. The shift register according to the embodiments of the disclosure is triggered by a high level and is driven by the cooperation of the transistors. In the case that the shift register is applied in the gate driving circuit to implement the line-by-line scanning, shift registers corresponding to two adjacent pixel rows are cascaded directly and a high level signal is transmitted stage by stage, thereby triggering the shift registers without any inverters following the shift registers corresponding to the respective pixel rows. Therefore, the number of transistors in the gate driving circuit is decreased and a layout area of the gate driving circuit is reduced, which is advantageous for narrowing the border.

Based on any one of the above embodiments, in an embodiment of the disclosure, the shift register may further include a tenth transistor M10. Reference is made to FIG. 4 which shows another shift register according to an embodiment of the disclosure. The tenth transistor M10 is controlled by the voltage of the first node N1 and configured to transmit the first reference voltage VGH to the second node N2. Specifically, in the embodiment, since the voltage of the first node N1 is at the first level at the second stage, the tenth transistor M10 is turned on, the first reference voltage VGH is transmitted to the second node N2 via the tenth transistor M10, and accordingly, the second transistor M2 maintains turned off.

It should be noted that, a driving method for the shift register including the tenth transistor M10 is substantially same as the driving method for the shift register not including the tenth transistor M10 and is accordingly not repeated here.

According to the above, a high-level triggering is used in the driving method according to the embodiments of the disclosure. In the case that the driving method is applied to the gate driving circuit to implement the line-by-line scanning, shift registers corresponding to two adjacent pixel rows are cascaded directly and a the high level signal is transmitted stage by stage, thereby triggering the shift registers without any inverters following the shift registers corresponding to the respective pixel rows. Therefore, the number of transistors in the gate driving circuit is decreased and a layout area of the gate driving circuit is reduced, which is advantageous for narrowing the border.

Figure 6:
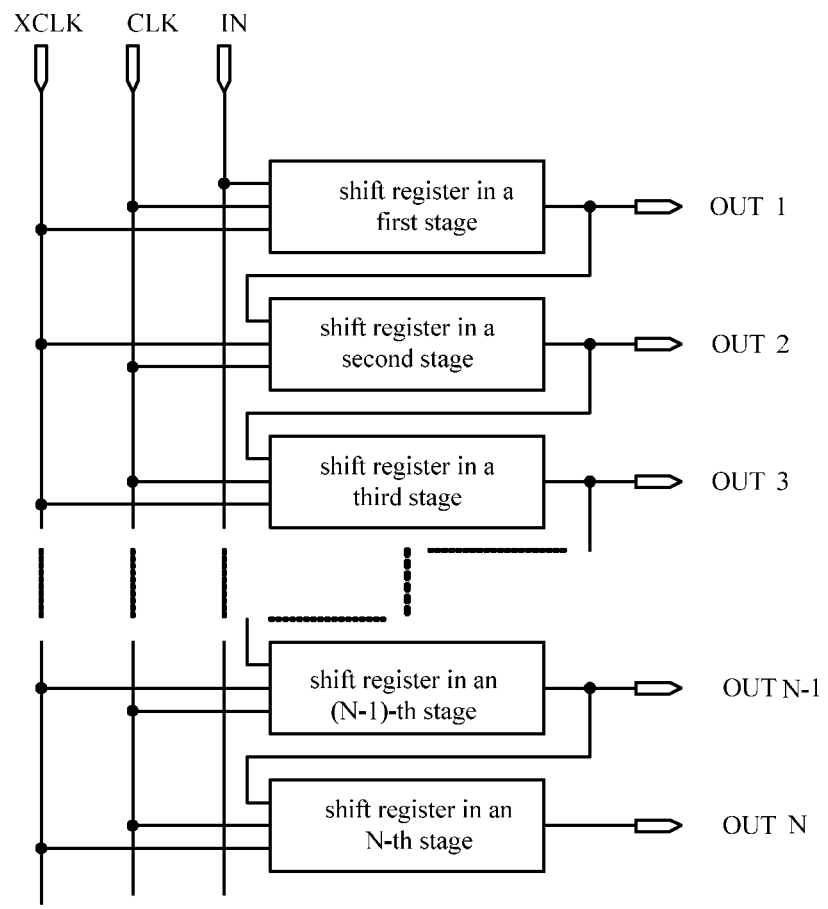
FIG. 6 is a schematic diagram of a gate driving circuit according to an embodiment of the disclosure.

A gate driving circuit is further provided according to an embodiment of the disclosure. As shown in FIG. 6, the gate driving circuit includes N cascaded shift registers. The N cascaded shift registers include a shift register in a first stage to a shift register in an N-th stage, where N is a positive integer greater than 2. The shift register is the shift register according to any one of the above embodiments of the disclosure.

Based on the above embodiment, in one embodiment of the disclosure, the gate driving circuit is configured to perform a forward scan. An input signal of the shift register in the first stage is a scan starting signal, and an input signal of a shift register in an n-th stage is an output signal of a shift register in an (n−1)-th stage, where n is a positive integer larger than 1 and not larger than N. In another embodiment of the disclosure, the gate driving circuit is configured to perform a reverse scan. An input signal of the shift register in the N-th stage is a scan starting signal, and an input signal of a shift register in an n-th stage is an output signal of a shift register in an (n+1)-th stage, where n is a positive integer larger than 1 and smaller than N. Whether the gate driving circuit is configured to perform a forward scan or a reverse scan is not limited in the disclosure and depends on the specific situations.

According to the above, a high-level triggering is used in the gate driving circuit provided in the embodiments of the disclosure. Shift registers in the respective stages are cascaded directly and a high level signal is transmitted stage by stage, thereby triggering the shift registers without any inverters provided between two cascaded shift registers. Therefore, the number of transistors in the gate driving circuit is decreased, a layout area of the gate driving circuit is reduced, and the area of the border of a display panel in which the gate driving circuit is installed is reduced, which is advantageous for narrowing the border.

Those skilled in the art can implement or use the disclosure based on the above illustration of the disclosed embodiments. Various modifications to these embodiments are apparent for those skilled in the art, and general principles defined herein may be implemented in other embodiments without departing from the spirit or scope of the disclosure. Hence, the disclosure is not limited by the embodiments disclosed herein, but is to conform to the widest scope in consistent with the principles and novel features disclosed herein.

What is claimed is:

1. A shift register, comprising a first transistor, a second transistor, a third transistor, a fourth transistor, a fifth transistor, a sixth transistor, a seventh transistor, an eighth transistor, a ninth transistor, a first storage capacitor and a second storage capacitor; wherein the first transistor is controlled by a voltage of a first node and is configured to transmit a first reference voltage to an output terminal of the shift register;

the second transistor is controlled by a voltage of a second node and is configured to transmit a second reference voltage to the output terminal of the shift register, wherein the second reference voltage is lower than the first reference voltage;

the third transistor is controlled by a first clock signal and is configured to transmit the first reference voltage to the first node;

the fourth transistor is controlled by a voltage of a third node and is configured to transmit a second clock signal to the first node;

the fifth transistor is controlled by the first clock signal and is configured to transmit a control signal to the second node;

the sixth transistor is controlled by the first clock signal and is configured to transmit an input signal to a fourth node;

the seventh transistor is controlled by a voltage of the fourth node and is configured to transmit the first reference voltage to the third node;

the eighth transistor is controlled by the first clock signal and is configured to transmit a voltage of a fifth node to the third node;

the ninth transistor is controlled by the second reference voltage and is configured to transmit the second reference voltage to the fifth node;

the voltage of the fourth node is input to one polar plate of the first storage capacitor, and the first reference voltage is input to the other polar plate of the first storage capacitor; and the voltage of the second node is input to one polar plate of the second storage capacitor, and a voltage of the output terminal is input to the other polar plate of the second storage capacitor.

2. The shift register of claim 1, wherein a gate of the first transistor is electrically connected to the first node, the first reference voltage is input to a first electrode of the first transistor, and a second electrode of the first transistor is electrically connected to the output terminal;

a gate of the second transistor is electrically connected to the second node, a first electrode of the second transistor is electrically connected to the output terminal, and the second reference voltage is input to a second electrode of the second transistor;

the first clock signal is input to a gate of the third transistor, the first reference voltage is input to a first electrode of the third transistor, and a second electrode of the third transistor is electrically connected to the first node;

a gate of the fourth transistor is electrically connected to the third node, a first electrode of the fourth transistor is electrically connected to the first node, and the second clock signal is input to a second electrode of the fourth transistor;

the first clock signal is input to a gate of the fifth transistor, a first electrode of the fifth transistor is electrically connected to the second node, and the control signal is input to a second electrode of the fifth transistor;

the first clock signal is input to a gate of the sixth transistor, a first electrode of the sixth transistor is electrically connected to the fourth node, and the input signal is input to a second electrode of the sixth transistor;

a gate of the seventh transistor is electrically connected to the fourth node, the first reference voltage is input to a first electrode of the seventh transistor, and a second electrode of the seventh transistor is electrically connected to the third node;

the first clock signal is input to a gate of the eighth transistor, a first electrode of the eighth transistor is electrically connected to the third node, and a second electrode of the eighth transistor is electrically connected to the fifth node;

the second reference voltage is input to a gate of the ninth transistor, a first electrode of the ninth transistor is electrically connected to the fifth node, and the second reference voltage is input to a second electrode of the ninth transistor;

one polar plate of the first storage capacitor is electrically connected to the fourth node, and the other polar plate of the first storage capacitor is electrically connected to the first electrode of the seventh transistor; and one polar plate of the second storage capacitor is electrically connected to the second node, and the other polar plate of the second storage capacitor is electrically connected to the output terminal.

3. The shift register of claim 1, wherein the control signal is the first clock signal and the first clock signal is input to a second electrode of the fifth transistor.

4. The shift register of claim 1, wherein the control signal is the second reference voltage and the second reference voltage is input to a second electrode of the fifth transistor.

5. The shift register of claim 2, further comprising a tenth transistor; wherein
the tenth transistor is controlled by the voltage of the first node and is configured to transmit the first reference voltage to the second node.

6. The shift register of claim 5, wherein a gate of the tenth transistor is electrically connected to the first node, the first reference voltage is input to a first electrode of the tenth transistor, and a second electrode of the tenth transistor is electrically connected to the second node.

7. The shift register of claim 6, wherein the first clock signal and the second clock signal each comprises a plurality of first levels and a plurality of second levels, the first levels and the second levels are alternate, and the first level is the first reference voltage and the second level is the second reference voltage.

8. The shift register of claim 2, wherein a width to length ratio of a channel of the seventh transistor is greater than a width to length ratio of a channel of the ninth transistor, and a width to length ratio of a channel of the first transistor is greater than a width to length ratio of a channel of the second transistor.

9. A driving method applied to a shift register, wherein the shift register comprises a first transistor, a second transistor, a third transistor, a fourth transistor, a fifth transistor, a sixth transistor, a seventh transistor, an eighth transistor, a ninth transistor, a first storage capacitor and a second storage capacitor; wherein the first transistor is controlled by a voltage of a first node and is configured to transmit a first reference voltage to an output terminal of the shift register;

the second transistor is controlled by a voltage of a second node and is configured to transmit a second reference voltage to the output terminal, wherein the second reference voltage is lower than the first reference voltage;

the third transistor is controlled by a first clock signal and is configured to transmit the first reference voltage to the first node;

the fourth transistor is controlled by a voltage of a third node and is configured to transmit a second clock signal to the first node;

the fifth transistor is controlled by the first clock signal and is configured to transmit a control signal to the second node;

the sixth transistor is controlled by the first clock signal and is configured to transmit an input signal to a fourth node;

the seventh transistor is controlled by a voltage of the fourth node and is configured to transmit the first reference voltage to the third node;

the eighth transistor is controlled by the first clock signal and is configured to transmit a voltage of a fifth node to the third node;

the ninth transistor is controlled by the second reference voltage and is configured to transmit the second reference voltage to the fifth node;

the voltage of the fourth node is input to one polar plate of the first storage capacitor, and the first reference voltage is input to the other polar plate of the first storage capacitor; and the voltage of the second node is input to one polar plate of the second storage capacitor, and a voltage of the output terminal is input to the other polar plate of the second storage capacitor;

wherein the control signal is the first clock signal or the second reference voltage, and the driving method comprises:

at a first stage, maintaining the input signal at a first level, maintaining the first clock signal at a second level and maintaining the second clock signal at the first level to turn on the fifth transistor, the sixth transistor, the eighth transistor and the ninth transistor; wherein the first level is higher than the second level; when the eighth transistor and the ninth transistor are turned on, the second reference voltage is transmitted to the third node to turn on the fourth transistor, and the second clock signal at the first level is transmitted to the first node to turn off the first transistor; when the sixth transistor is turned on, the input signal at the first level is transmitted to the fourth node to charge the first storage capacitor; when the fifth transistor is turned on, the control signal is transmitted to the second node to turn on the second transistor, and the second reference voltage is transmitted to the output terminal via the second transistor and is output from the output terminal;

at a second stage, maintaining the input signal at the second level, maintaining the first clock signal at the first level and maintaining the second clock signal at the second level, wherein the voltage of the third node is at the second level to turn on the fourth transistor, the second clock signal at the second level is transmitted to the first node via the fourth transistor to turn on the first transistor, and the first reference voltage is transmitted to the output terminal via the first transistor and is output from the output terminal;

at a third stage, maintaining the input signal at the second level, maintaining the first clock signal at the second level and maintaining the second clock signal at the first level to turn on the fifth transistor, wherein the control signal at the second level is transmitted to the second node via the fifth transistor to turn on the second transistor and the second storage capacitor controls the second transistor to be turned on through a coupling function, and the second reference voltage is transmitted to the output terminal via the second transistor and is output from the output terminal; and at a fourth stage, maintaining the input signal at the second level, maintaining the first clock signal at the first level and maintaining the second clock signal at the second level, wherein the voltage of the second node is the second level stored by the second storage capacitor, the second transistor is turned on, and the second reference voltage is transmitted to the output terminal via the second transistor and is output from the output terminal.

10. The driving method of claim 9, wherein the first level is the first reference voltage and the second level is the second reference voltage.

11. The driving method of claim 10, wherein the shift register further comprises a tenth transistor, and the tenth transistor is controlled by the voltage of the first node and is configured to transmit the first reference voltage to the second node; and at the second stage, wherein the voltage of the first node is at the first level to turn on the tenth transistor, the first reference voltage is transmitted to the second node via the tenth transistor, and the second transistor maintains turned off.

12. A gate driving circuit, comprising N cascaded shift registers, wherein the N cascaded shift registers comprising from a shift register in a first stage to a shift register in an N-th stage, N is a positive integer greater than 2, and each shift register comprises a first transistor, a second transistor, a third transistor, a fourth transistor, a fifth transistor, a sixth transistor, a seventh transistor, an eighth transistor, a ninth transistor, a first storage capacitor and a second storage capacitor; wherein the first transistor is controlled by a voltage of a first node and is configured to transmit a first reference voltage to an output terminal of the shift register;

the second transistor is controlled by a voltage of a second node and is configured to transmit a second reference voltage to the output terminal, wherein the second reference voltage is lower than the first reference voltage;

the third transistor is controlled by a first clock signal and is configured to transmit the first reference voltage to the first node;

the fourth transistor is controlled by a voltage of a third node and is configured to transmit a second clock signal to the first node;

the fifth transistor is controlled by the first clock signal and is configured to transmit a control signal to the second node;

the sixth transistor is controlled by the first clock signal and is configured to transmit an input signal to a fourth node;

the seventh transistor is controlled by a voltage of the fourth node and is configured to transmit the first reference voltage to the third node;

the eighth transistor is controlled by the first clock signal and is configured to transmit a voltage of a fifth node to the third node;

the ninth transistor is controlled by the second reference voltage and is configured to transmit the second reference voltage to the fifth node;

the voltage of the fourth node is input to one polar plate of the first storage capacitor, and the first reference voltage is input to the other polar plate of the first storage capacitor; and the voltage of the second node is input to one polar plate of the second storage capacitor, and a voltage of the output terminal is input to the other polar plate of the second storage capacitor.

13. The gate driving circuit of claim 12, wherein the gate driving circuit is configured to perform a forward scan, an input signal of the shift register in the first stage is a scan starting signal; and an input signal of a shift register in an n-th stage is an output signal of a shift register in an (n+1)-th stage, where n is a positive integer larger than 1 and not larger than N.

14. The gate driving circuit of claim 12, wherein the gate driving circuit is configured to perform a reverse scan, an input signal of the shift register in the N-th stage is a scan starting signal; and an input signal of a shift register in an n-th stage is an output signal of a shift register in an (n+1)-th stage, where n is a positive integer larger than 1 and smaller than N.

15. The shift register of claim 2, wherein the control signal is the first clock signal and the first clock signal is input to the second electrode of the fifth transistor.

16. The shift register of claim 2, wherein the control signal is the second reference voltage and the second reference voltage is input to the second electrode of the fifth transistor.

* * * * *